US009211755B2

(12) United States Patent
Vegelahn et al.

(10) Patent No.: US 9,211,755 B2
(45) Date of Patent: Dec. 15, 2015

(54) PRINTING TABLE ASSEMBLY, METHOD FOR OPERATING A PRINTING TABLE ASSEMBLY

(75) Inventors: Torsten Vegelahn, Sternenfels (DE); Alfred Heupel, Heilbronn (DE); Stephan Bergmoser, Geisenfeld (DE); Michael Hammann, Oberderdingen-Flehingen (DE)

(73) Assignee: EKRA AUTOMATISIERUNGSSYSTEME GMBH, Bonnigheim (DE)

( * ) Notice: Subject to any disclaimer, the term of this patent is extended or adjusted under 35 U.S.C. 154(b) by 319 days.

(21) Appl. No.: 13/996,275

(22) PCT Filed: Dec. 21, 2011

(86) PCT No.: PCT/EP2011/006470
§ 371 (c)(1),
(2), (4) Date: Jun. 20, 2013

(87) PCT Pub. No.: WO2012/084223
PCT Pub. Date: Jun. 28, 2012

(65) Prior Publication Data
US 2013/0295285 A1 Nov. 7, 2013

(30) Foreign Application Priority Data
Dec. 21, 2010 (DE) .......................... 10 2010 056 123

(51) Int. Cl.
*B41M 99/00* (2006.01)
*B41F 15/08* (2006.01)
(Continued)

(52) U.S. Cl.
CPC ............ *B41M 99/00* (2013.01); *B41F 15/0881* (2013.01); *B41F 15/26* (2013.01);
(Continued)

(58) Field of Classification Search
CPC ................................. B41F 15/16; B41F 15/26
See application file for complete search history.

(56) References Cited

U.S. PATENT DOCUMENTS 7,849,792 B2    12/2010   Bauer et al.
2008/0028955 A1*  2/2008  Bauer et al. ..................... 101/44
(Continued)

FOREIGN PATENT DOCUMENTS

DE              4126095 A1    2/1993
DE        10 2008 051052 A1   4/2010
(Continued)

OTHER PUBLICATIONS

First Office Action regarding China Application No. 2014091800985260 dated Sep. 23, 2014.
(Continued)

*Primary Examiner* — Cachet Sellman
(74) *Attorney, Agent, or Firm* — Harness, Dickey & Pierce, P.L.C.

(57) ABSTRACT

A printing table arrangement includes at least one printing device for printing of substrates, at least one printing table, a first transport device to transport the substrates being printed in a first plane, and a lifting device to move the first transport device with the first plane between a printing plane assigned to the printing device and a transport plane lying underneath. The printing table has a second transport device to transport substrates in a second plane beneath the first plane, in which the fixed spacing between the first plane and the second plane corresponds to the spacing between the printing plane and transport plane.

11 Claims, 6 Drawing Sheets

(51) Int. Cl.
  *B41F 15/26* (2006.01)
  *B41F 17/24* (2006.01)
  *B41J 11/06* (2006.01)
  *B41J 11/20* (2006.01)
  *H01L 21/677* (2006.01)
  *H05K 3/12* (2006.01)

(52) U.S. Cl.
  CPC ........... *B41F 17/24* (2013.01); *B41J 11/06* (2013.01); *B41J 11/20* (2013.01); *H01L 21/6776* (2013.01); *H01L 21/67748* (2013.01); *H05K 3/12* (2013.01); *B41P 2217/56* (2013.01)

(56) References Cited

U.S. PATENT DOCUMENTS

| | | |
|---|---|---|
| 2008/0213071 A1 | 9/2008 | Fritsche |
| 2008/0251019 A1 | 10/2008 | Krishnaswami |
| 2009/0158944 A1* | 6/2009 | Tanaka et al. .............. 101/129 |
| 2010/0313773 A1 | 12/2010 | Naoi et al. |
| 2011/0239883 A1 | 10/2011 | Vegelahn et al. |

FOREIGN PATENT DOCUMENTS

| | | |
|---|---|---|
| EP | 1 886 812 A2 | 2/2008 |
| JP | 2001-038876 A | 2/2001 |
| JP | 2001038876 A * | 2/2001 |

OTHER PUBLICATIONS

International Search Report and Written Opinion of the ISA for PCT/EP2011/006470, ISA/EP, Rijswijk, NL, mailed Apr. 5, 2012.
International Preliminary Report on Patentability regarding Application No. PCT/EP2011006470 issued Jun. 25, 2013.

* cited by examiner

PRINTING TABLE ASSEMBLY, METHOD FOR OPERATING A PRINTING TABLE ASSEMBLY

CROSS-REFERENCE TO RELATED APPLICATIONS

This application is a 371 U.S. National Stage of International Application No. PCT/EP2011/006470, filed Dec. 21, 2011, which claims priority to German Patent Application No. 10 2010 056 123.1, filed Dec. 21, 2010. The disclosures of the above applications are incorporated herein by reference.

FIELD

The invention concerns a printing table arrangement with at least one printing device for printing of substrates and at least one printing table, which has a first transport device to transport the substrates being printed in a first plane and a lifting device for moving of the first transport device with the first plane between a printing plane assigned to the printing device and an underlying transport plane.

The invention also concerns a method for operation of a printing table arrangement, especially as described above, with at least one printing device for printing of substrates and with at least one printing table, which has a first transport device to transport the substrates being printed in a first plane and a lifting device for moving of the first transport device with the first plane between a printing plane assigned to the printing device and an underlying transport plane.

BACKGROUND

Printing table arrangements as well as methods for their operation are widely known from the prior art. They generally have a printing table, to which a substrate, like a circuit board, a ceramic plate, a solar cell substrate, a foil or the like can be supplied by means of a feed device. The printing table itself has a first transport device, which serves to transport and optionally to align the substrate in a first plane. The planes mentioned here are to be understood as imaginary planes that extend parallel to the printing device or at least essentially perpendicular to the printing direction of the printing device. It is also known to provide printing tables of such printing table arrangements with a lifting device, which moves the first transport device of the first plane between a printing plane assigned to the printing device and an underlying transport plane. In this case a distinction is made between a transport plane, in which the substrate or substrates are transported through the printing table arrangement, as well as the printing plane in which substrates can be printed by the printing device. The substrates that are transported by the first transport device are raised by means of the lifting device from the transport plane into the printing plane in the direction of the printing device in order to optimally adjust the spacing between the printing device and the substrate for the printing process.

A shortcoming in known printing table arrangements is that during the printing process the printing table arrangement is blocked for feed of additional substrates so that time is lost, in particular, during mass production.

SUMMARY

The underlying task of the invention is therefore to devise a printing table arrangement as well as a method for operation of a printing table arrangement, which permit time-optimized processing and printing of substrates.

The task underlying the invention is solved by the features of the independent claims. The printing table arrangement according to the invention has the advantage that while a substrate is being printed and/or aligned by means of the first transport device, an additional substrate can be conveyed by the printing table arrangement. The printing table arrangement according to the invention is characterized by the fact that the first printing table has a second transport device to transport substrates in a second plane beneath the first plane, in which the fixed distance between the first plane and the second plane corresponds to the distance between the printing plane and the transport plane. The printing table therefore includes two transport devices that are designed to transport substrates in different planes. Preferably the planes are aligned parallel to each other, in which case the second plane lies beneath the first plane, i.e., on the side of the first plane opposite the printing device. The distance between the first and second plane is chosen fixed and corresponds to the distance between the printing plane and the transport plane between which the first plane can be moved by means of the lifting device. This means that when the first transport device with the first plane is moved from the transport plane into the printing plane, the second transport device with the second plane lies in the transport plane. While the printing device can print the substrate lying in the first plane or in the printing plane and/or the substrate is aligned by the first transport device, an additional substrate can be transported by the printing table by means of the second transport device into the transport plane. The additional substrate, for example, can be a substrate removed as a defective part in the feed to the printing table arrangement, which is then transported through the printing table arrangement by the second transport device, while the first substrate is being printed. Likewise, the additional substrate can be a substrate to be printed, which is conveyed by the second transport device to a second printing station, especially to an additional printing table. The essential advantage of the present invention therefore lies in the fact that, while a substrate is being printed, an additional substrate can be transported through the printing table and printing table arrangement in order to be further processed, especially at a different location.

A feed device to feed substrates in the transport plane is preferably assigned to the printing table. The feed device can also preferably be a device that conveys or transports the substrates in a plane, especially linearly. By the arrangement of the transport plane the substrate fed by the feed device is fed to the first or second transport device of the printing table lying in the transport plane, in which it can be selected by means of the lifting device to which of the transport devices the substrate is fed.

The printing table arrangement preferably has at least one additional (second) printing table corresponding to the above described (first) printing table, which is arranged in the transport direction behind the printing table and has at least an additional first transport device to transport the substrates being printed in a first plane and an additional lifting device to move the additional first transport device with its first plane between the printing plane and the underlying transport plane. The printing table arrangement therefore includes at least two printing tables that are arranged one behind the other when viewed in the transport direction. The additional first transport device of the additional printing table can also be moved with the first plane between the printing plane and the transport plane of the printing table arrangement. The additional printing table is preferably arranged so that a substrate transported by the printing table in the transport plane can be transferred to the additional printing table. Because of this it is possible, in particular, to feed the substrate transported by the second transport device in the transport plane to the additional first transport device of the additional printing table, in which case the additional first transport device can then be moved by the additional lifting device into the printing plane or into a printing position. Consequently, while a first substrate is being printed on the first printing table, an additional substrate is preferably transported by the first printing table in the transport plane by means of the second transport device and fed to the additional printing table or its additional first transport device so that printing and transport of substrates simultaneously is possible.

With particular preference the additional printing table has an additional second transport device to transport substrates into a second plane beneath the first plane, in which the fixed distance between the first plane and the second plane of the additional transport devices corresponds to the distance between the printing plane and transport plane. The design of the additional printing table therefore corresponds to the previously described printing table so that a substrate can also be conveyed by the additional printing table while another substrate is being printed on the additional first transport device. The first transport device and the additional first transport device are preferably moved in alternation by means of the corresponding lifting device into the transport plane so that, in particular, a substrate is fed to the additional first transport device and the second printing table, while a substrate is being printed on the first printing table and a substrate is being printed on the second printing table, while the printed substrate of the first printing table can be transported by means of the additional second transport device of the additional printing table from the printing table arrangement.

The adjacent transport devices of the printing tables lying in the transport plane or the printing plane are each designed to convey substrates from the transport device of one of the printing tables to the adjacent transport device of the adjacent printing table. The transport devices are therefore aligned and/or designed so that the substrates can be conveyed or transported from one printing table to the adjacent printing table when they lie adjacent in the transport plane or in the printing plane.

According to an advantageous modification of the invention it is prescribed that the first and the second transport devices of the corresponding printing table are arranged one above the other or offset laterally relative to each other. If the first and second transport devices of a printing table are arranged one above the other, they lie overlapping in the corresponding plane so that the corresponding printing table is designed narrow. If the transport devices are arranged next to each other or laterally offset relative to each other in the corresponding plane, the printing table is desired wider, but the spacing between the planes can be reduced. The first transport device of one printing table and the additional second transport device of the additional printing table, as well as a second transport device of the one printing table and the additional transport device of the additional printing table are preferably designed for transport of the same substrates or substrates with the same width and therefore each form a transport line. As an alternative, the corresponding transport lines can also have different widths so that a substrate with a first width is always printed on the one printing table and a substrate with a width and/or length deviating from this is always printed on the additional printing table. Because of this differently shaped substrates can be printed in time-optimized fashion cost-effectively and efficiently by means of the same printing table arrangement. If the first and second transport devices are arranged next to other, the printing table arrangement has a feed device assigned to the corresponding transport device in the transport plane.

According to an advantageous modification it is preferably prescribed that the printing device has a printing head for several printing tables and/or at least one printing head for each of the printing tables. If one printing head is prescribed, a printing process can occur independently on each of the printing tables. It is possible by advantageous formation of the printing table arrangement to print a substrate that extends over the transport length of both printing tables. For this purpose the printing tables are each moved with their first transport device into the transport plane, the substrate is supplied and the first two transport devices are simultaneously moved into the printing plane by means of lifting devices in order to be printed there by the printing device with one or also with several printing heads.

The method according to the invention is characterized by the fact that the first printing table is provided with a second transport device to transport substrates in a second plane beneath the first plane, in which the fixed distance between the first plane and the second plane corresponds to the distance between the printing plane and the transport plane with the following steps: Initially the first transport device is moved with the first plane into the transport plane. A first substrate is then fed to the first transport device of the printing table. The first transport device with the first plane is then moved into the printing plane for printing of the substrate by means of the printing device. Finally a second substrate is fed to the second transport device now lying in the transport plane and transported through the first printing table by means of the transport device, while the printing device prints the first substrate. Because of this the already described advantages are obtained. As preparation for the printing process the first substrate is preferably aligned by means of the first transport device of the printing table relative to the printing device. For this purpose known methods can be used, like optical methods for detecting the alignment of the substrate on the first transport device.

The second substrate is preferably fed to an additional first transport device of an additional printing table through the second transport device of a first printing table.

With particular preference, the additional first transport device of the additional printing table is moved by means of a lifting device into the transport plane for printing of the second substrate by the printing device.

The first transport device of the printing table with the printed first substrate is also preferably moved into the transport plane and the printed first substrate fed to an additional second transport device of the additional printing table by the first transport device of the printing table, while the printing device is printing the second substrate of an additional printing table.

Overall a printing table arrangement and a method for its operation are therefore offered, which offer in simple fashion a time saving, especially during mass production of substrates.

DESCRIPTION OF THE DRAWINGS

The invention is to be further explained below with reference to the drawing. For this purpose

DETAILED DESCRIPTION

Figure 1:
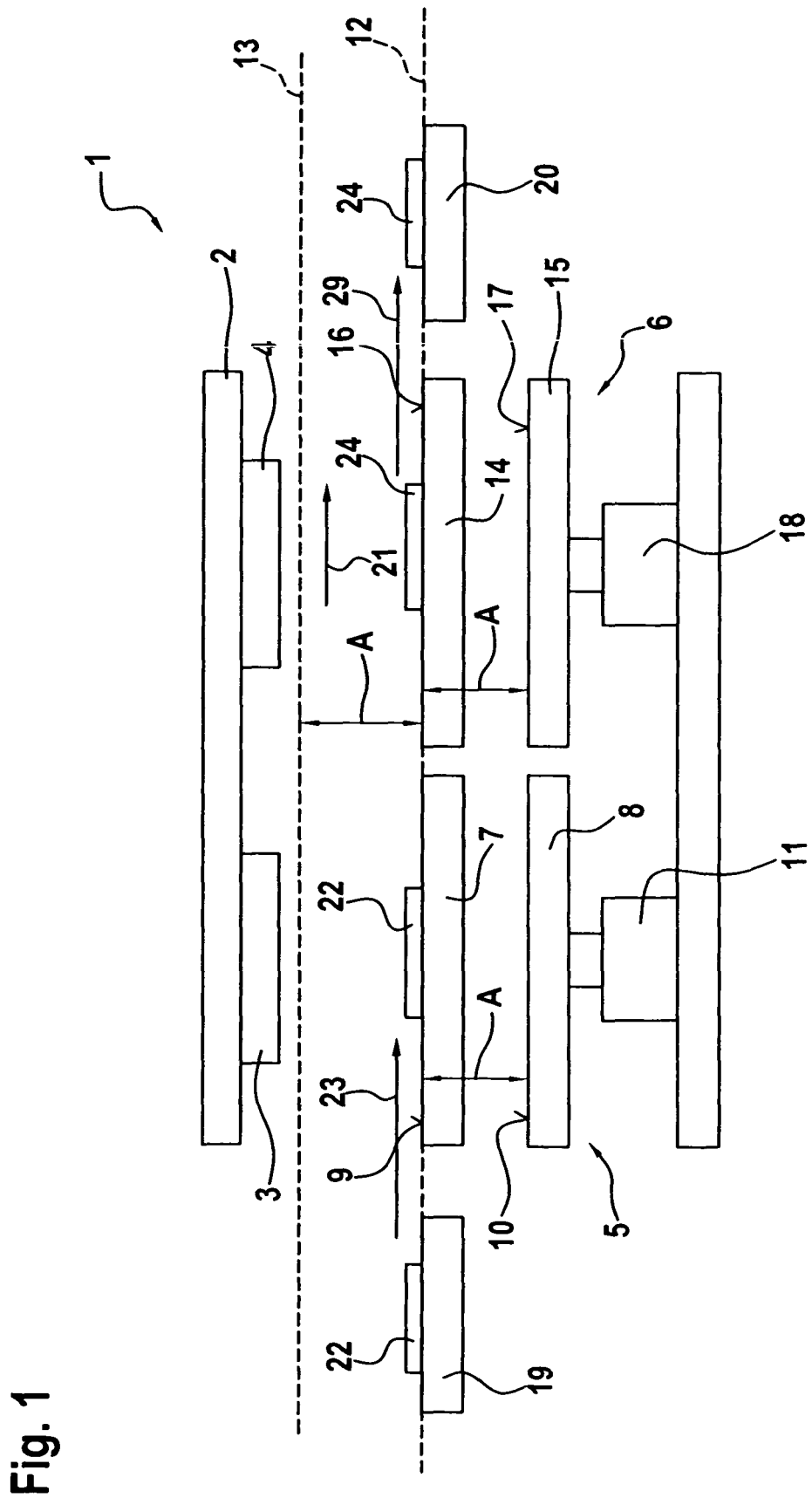
FIG. 1 shows an advantageous printing table arrangement in a simplified view.

FIG. 1 shows in a simplified view a printing table arrangement 1 for printing of substrates, like circuit boards, ceramic plates, solar cell substrates, foils or the like. For this purpose the printing table arrangement 1 has a printing device 2, which includes two printing heads 3, 4. A printing table 5 or 6 is assigned to each of the printing heads 3, 4. The printing table 5 has a first transport device 7 as well as a second transport device 8, each of which serves to transport a substrate in a plane. The transport device 7 is then designed so that it can transport a substrate in a first plane 9 parallel to the printing device 2 and align it relative to printing head 3. The transport device 8 is rigidly connected to the transport device 7 (for reasons of clarity the corresponding connections between the transport device 7 and 8 are not shown) and serves to transport a substrate in a second plane 10 that extends parallel to the first plane 9. Since the transport devices 7 and 8 are firmly connected to each other, the planes 9 and 10 have a fixed spacing 8 relative to each other. The printing table 5 also has a lifting device 11, which serves to move the first transport device 7 and therefore also to move the second transport device 8. The lifting device 11 is designed so that it moves the first transport device with the first plane 9 between a transport plane 12 and printing plane 13 assigned to the printing device 2. The locations of the transport plane 12 and the printing plane 13 are indicated here by the dashed lines, in which the transport plane 12 and the printing plane 13 also have a spacing A relative to each other.

The additional printing table 6 has an additional first transport device 14, as well as an additional second transport device 15, which correspond to the transport devices 7 and 8, the additional first transport device 14 serving to transport and align a substrate in an additional first plane 16 and the additional second transport device 15 serving to transport a substrate in an additional second plane 17. Planes 16 and 17 are arranged at a fixed spacing A relative to each other because of the fixed connection between the transport devices 14 and 15, which corresponds to the spacing A between planes 9 and 10. The additional printing table 6 also includes a lifting device 18, which, like the lifting device 11, moves the transport device 14 with its plane 16 between transport plane 12 and printing plane 13. The lifting devices 11 and 18 are preferably designed as motor-driven, especially electric motor, pneumatic or hydraulic lifting cylinders or in another way known to one skilled in the art.

Printing table arrangement 1 also includes a feed device 19 as well as a removal device 20, which serve for transport of the substrates in the transport plane 12. The feed device 19 is assigned to printing table 5 and designed so that it transports a substrate in the transport plane 12 and as required feeds it to transport device 7. The removal device 20 is assigned to printing table 6 and is designed so that it removes an especially printed substrate from the transport device 14 or 15 lying in transport plane 12 and can remove it or transport it away from the printing table arrangement 1.

The transport devices 7, 8, 14, 15 as well as the feed device 19 and the removal device 20 are preferably each designed in the fashion of the conveyor belt in order to transport the substrates through the printing table arrangement 1 at least in the direction of arrow 21 from the feed device 19 to the removal device 20. The transport devices 7, 8 and 14 and 15 are designed so that they each can guide substrates in the transport directions of the adjacent printing tables 5 and 6 lying in the transport plane 12 from one transport device to the adjacent transport device. The method of function of a printing table arrangement 1 will be explained below with reference to a practical example.

Figure 2:
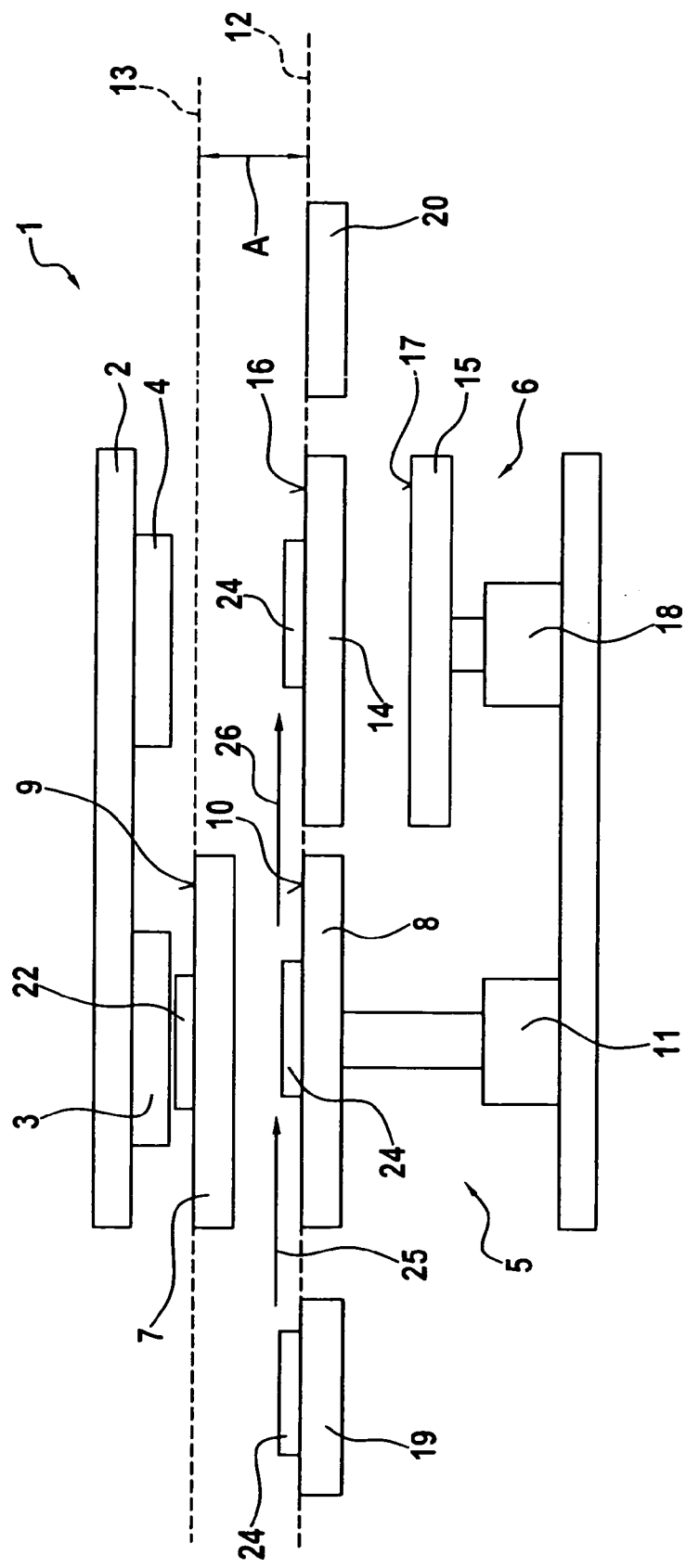
FIG. 2 shows the printing table arrangement in a first printing state.
Figure 3:
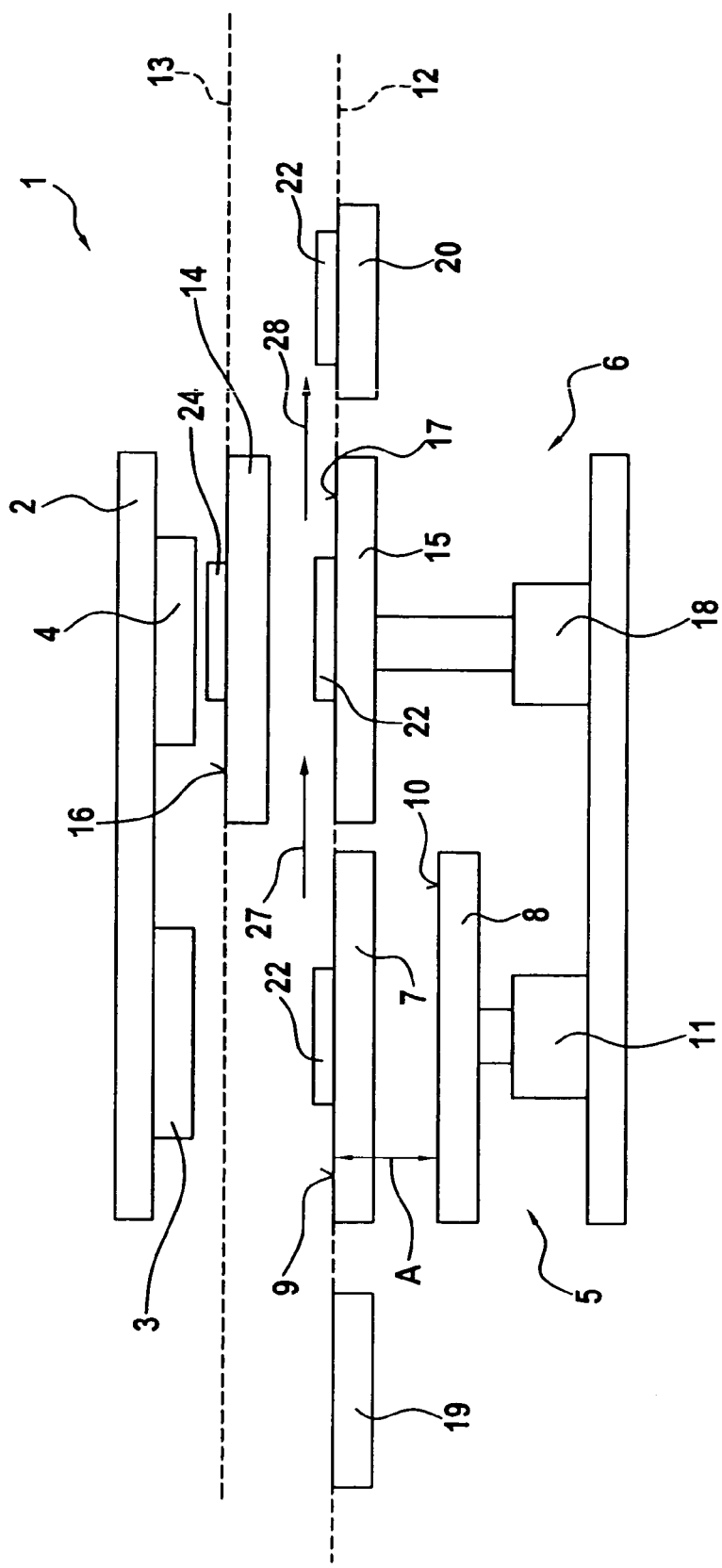
FIG. 3 shows the printing table arrangement in a second printing state.

FIG. 1 shows one possible initial state of the printing table arrangement 1 during startup. FIGS. 2 and 3 show the printing table arrangement in different printing positions, in which elements known from FIG. 1 are provided with the same reference numbers so that to this extent the aforementioned description is referred to.

Initially a first substrate 22 is fed by means of feed device 19 to the transport device 7 of printing table 5, as indicted by arrow 23. The transport device 7 is then moved or positioned by means of the lifting device 11 with its plane 9 into the printing plane 13, as shown in FIG. 2. In this operating position the substrate 22 is preferably aligned by means of the transport device 7 relative to printing head 3 and then printed accordingly. During this, a second substrate is now fed by means of a feed device 19 to the second transport device 8 lying with its plane 10 in transport plane 12, as indicated by arrow 25. The transport device 8 conveys the second substrate 24 in the transport plane 12 to the first transport device 14 of the second printing table 6, whose plane 16 is also situated in transport plane 12, as indicated by arrow 26. Consequently, while the first substrate 22 is being printed and further aligned, the second substrate 24 is already being conveyed to the second printing table 6 and its first transport device 14.

The first transport device 14 with its plane 16 is then moved from the transport plane 12 into the printing plane 13 by means of the lifting device 18 as shown in FIG. 3. The additional first transport device 14 of the additional printing table 6 is situated here with its plane 16 in the printing planes 13 so that the substrate 24 can be printed by printing head 4. The substrate 24 is optionally aligned or adjusted before the printing process by the transport device 14 relative to printing head 4. If the printing process on printing table 5 is completed, as also shown in FIG. 3, the transport device 7 is moved back into its initial position by means of the lifting device 11 so that plane 19 lies in the transport plane 12. The now printed substrate 22 is fed to the second transport device 15 of the second printing table 6 now lying in the transport plane 12, as indicated by arrow 27. The transport device 15 transports the substrate further and guides it to the removal device 20, as indicated by arrow 28, so that the printed first substrate 22 leaves the printing table arrangement 1 and is guided, for example, into a stacking, packaging or further processing device. As soon as the substrate 22 has left the first printing table 5, a new substrate can be fed by means of feed device 19 to the transport device 7 or the first printing table 5 for printing. As soon as the substrate 24 has been printed by the printing head 4, the transport device 14 is moved by means of lifting device 18 back into its initial position so that the plane 16 lies in the transport plane 12 and the now printed substrate 24 is also fed to the removal device 20 for further processing or for transport, as indicated in FIG. 1 by arrow 29. While the lifting device 18 of the printing table 6 moves the transport devices 16 and 15 back into their initial position, the lifting device 11 of printing table 5 preferably moves the transport devices 7 and 8 into their printing position so that the transport device 7 with its plane 9 lies in printing plane 13. The printing tables 5 and 6 are therefore preferably positioned or moved in alternation in order to bring the corresponding substrates into the printing position. Since the distance between planes 9 and 10 or 16 and 17 corresponds to the distance between the transport plane 12 and the printing plane 13, it is always guaranteed that an additional substrate can be conveyed through the corresponding printing table 5 or 6, which is situated in its printing position. The time demand for printing of several substrates by means of the printing table arrangement is therefore substantially reduced.

Figure 4:
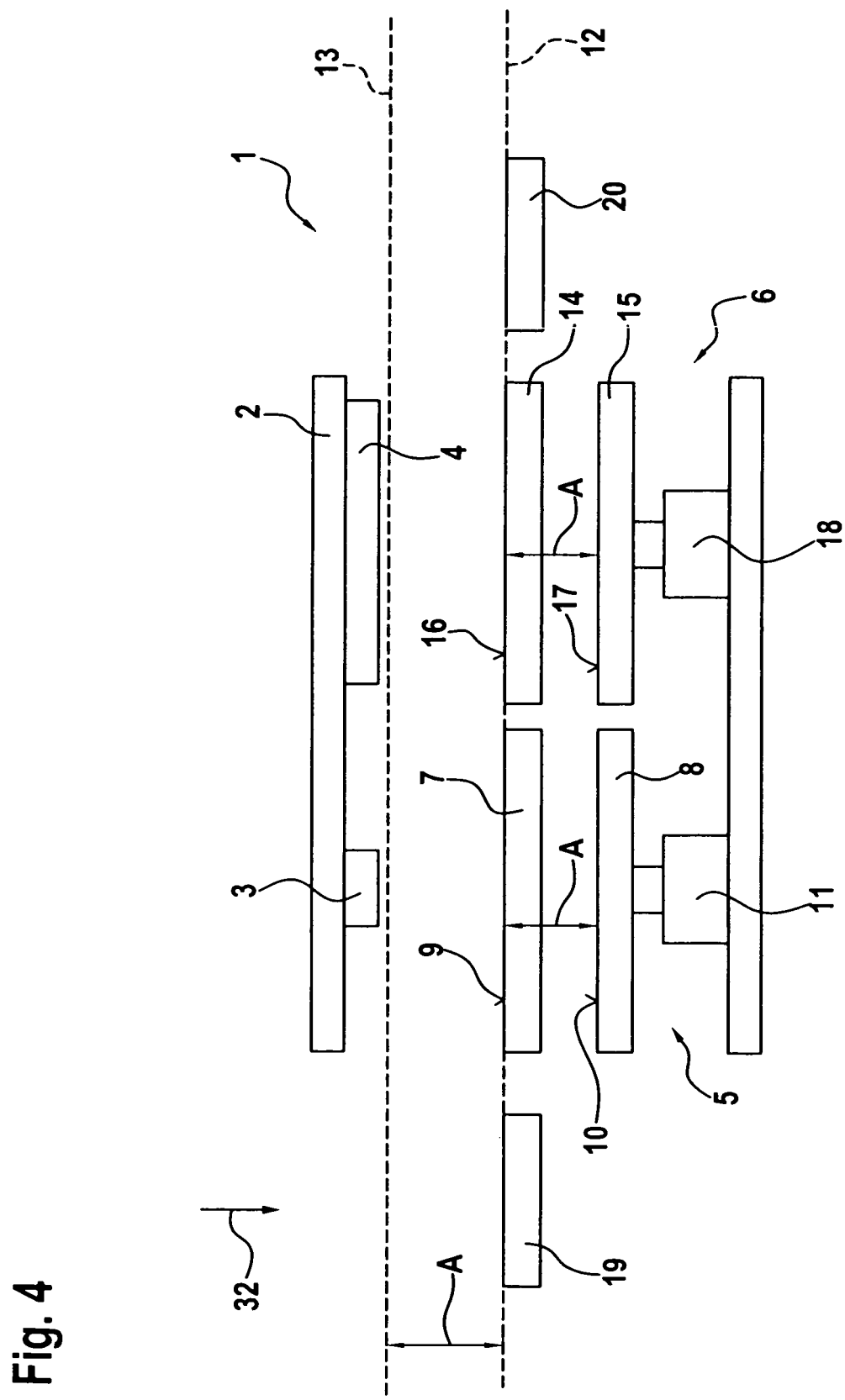
FIG. 4 shows an advantageous embodiment of the printing table arrangement for substrates of different size.

FIG. 4 shows a modification of the printing table arrangement in which elements known from the preceding figures are provided with the same reference numbers so that to this extent the aforementioned description is referred to. Essentially only the differences are taken up below. The embodiments according to FIG. 4 differ from the preceding embodiment of the printing table arrangement 1 in that the printing tables 5 and 6 are designed for printing of different substrates. This is indicated in FIG. 4 by printing heads 3 and 4 of different size. The printing heads 3 and 4 are designed especially for printing of substrates of different length (viewed in the transport direction according to arrow 21), which preferably have the same width. If substrates of preferably different alternating length are fed to the printing tables 5 and 6 by means of feed device 19, different substrates can continuously be printed on the two printing tables 5 and 6.

Figure 5:
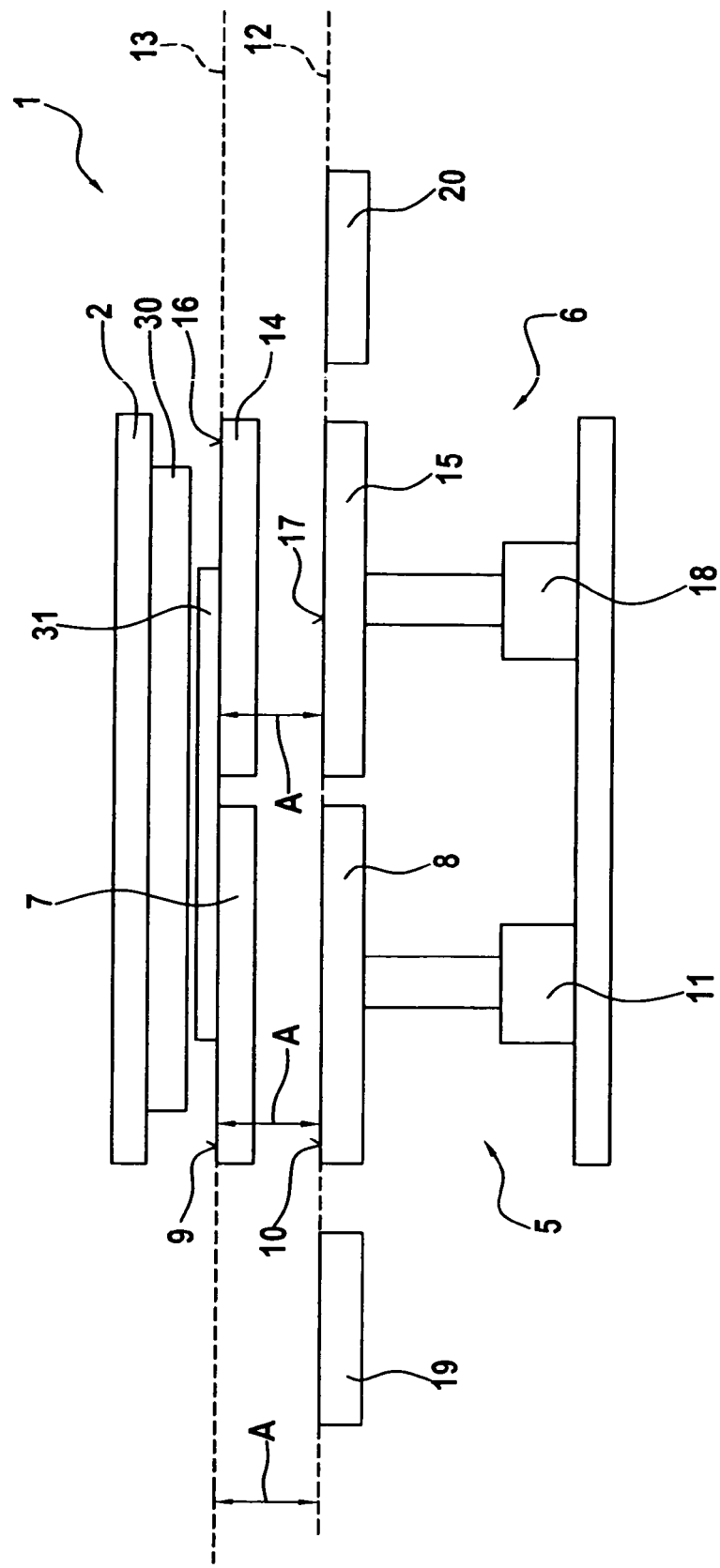
FIG. 5 shows an advantageous embodiment of the printing table arrangement for substrates with overlengths and FIG. 6 shows an advantageous embodiment of the printing table arrangement for substrates with different width.

FIG. 5 shows another embodiment of the printing table arrangement 1, which differs from the preceding printing table arrangements essentially in that a single printing head 30 is provided, which extends essentially over the entire width of the printing table arrangement 1. If the lifting devices 11 and 18 are driven so that the first transport devices 7 and 14 are positioned or moved parallel to each other, it is possible to print an overlong substrate 31, i.e., a substrate that is longer than one of the printing tables, by means of both printing tables 5 and 6 in the printing plane 13 or in the printing position and print them by means of printing head 30. With particular preference the printing heads 3 and 4 are designed so that they can be moved laterally in order to form the printing head 30 depicted in FIG. 5.

Figure 6:
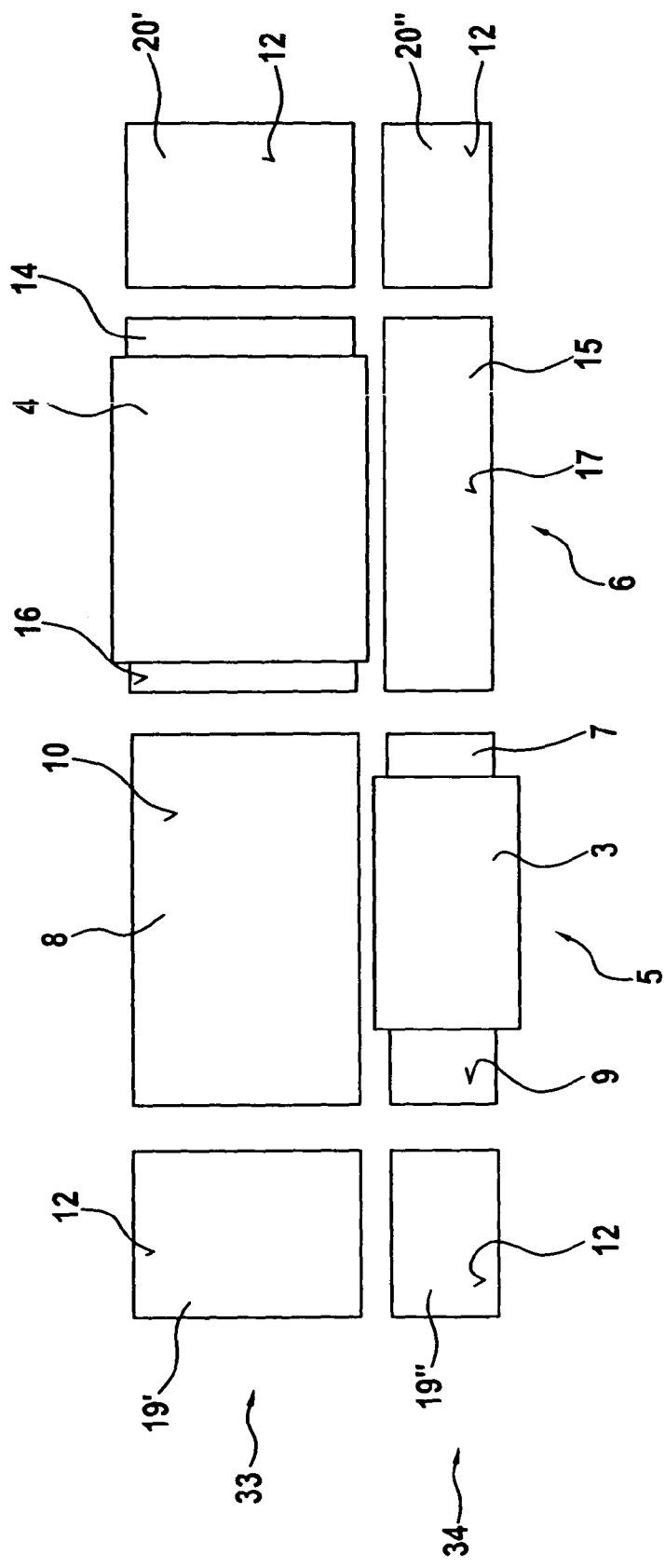

FIG. 6 shows another embodiment of the printing table arrangement 1 in a simplified view, but this time in a top view in the direction of arrow 32 as shown in FIG. 4. Whereas with reference to the preceding embodiments it was assumed that the transport devices 7, 8 and 14, 15 are each arranged directly one above the other or one below the other so that the corresponding transport device overlap in the top view from the direction of arrow 32, it is prescribed according to the embodiment in FIG. 6 that the transport devices 7, 8 and 14, 15 are each arranged laterally offset relative to each other or next to each other on the corresponding printing table 5 or 6. While the feed device 19, which in the present case is formed from the two feed devices 19' and 19", and the removal device 20, which in the present case is formed by two removal devices 20' and 20" arranged next to each other, also lie in the transport plane 12, the transport devices 7, 8 and 15, 14, as previously described, also lie in different planes, depending on the travel path of the corresponding lifting device 11, 18. According to this embodiment several feed devices and removal devices are required, but not only substrates of different length, but also substrates of different width can be printed by means of the printing table arrangement 1, as described above. The feed device 19', transport devices 8 and 14 as well as the removal device 20' here form a first transport line 33 for substrates with a maximum first width, and the feed device 19", the transport devices 7 and 15 as well as the removal device 20" form a second transport line 34 for substrates with a maximum second width, which is smaller than the maximum first width. The transport lines 33 and 34 are also found in the above described embodiments in which the transport devices are not arranged next to each other, but one above the other so that only one feed device 19 or only one removal device 20 is necessary.

The described advantageous printing table arrangement can be supplemented in its above described variation by additional correspondingly designed printing tables that are connected in the transport direction.

The invention claimed is:

1. A printing table arrangement comprising:
   at least one printing device for printing of substrates;
   at least a first printing table;
   a first transport device to transport the substrates being printed in a first plane;
   a lifting device to move the first transport device with the first plane between a printing plane assigned to the printing device and a transport plane lying underneath; and
   a second transport device to transport substrates in a second plane beneath the first plane, in which a fixed spacing between the first plane and the second plane corresponds to a spacing between the printing plane and transport plane.

2. The printing table arrangement according to claim 1, further comprising a feed device assigned to the first printing table to feed substrates in the transport plane.

3. The printing table arrangement according to claim 1, further comprising at least a second printing table corresponding to the first printing table, which is arranged in a transport direction behind the first printing table and has at least one additional first transport device to transport the substrates being printed in an additional first plane and an additional lifting device to move the additional first transport device with the additional first plane between the printing plane and the transport plane.

4. The printing table arrangement according to claim 3, wherein the second printing table has an additional second transport device to transport substrates in an additional second plane beneath the first additional plane, in which the fixed spacing between the first additional plane and the second additional plane of the additional second transport device corresponds to the spacing between the printing plane and the transport plane.

5. The printing table arrangement according to claim 3, wherein the first and second transport devices of are arranged one above the other or laterally offset relative to each other.

6. The printing table arrangement according to claim 1, wherein adjacent transport devices of the first and second printing tables lying in the transport plane or in the printing plane are each designed to convey the substrates from one transport device of one of the first and second printing tables to the adjacent transport device of the other of the first and second printing tables.

7. The printing table arrangement according to claim 1, wherein the printing device has a printing head for several printing tables and/or at least one printing head for each of the first and second printing tables.

8. A method of operation of a printing table arrangement having at least one printing device for printing a plurality of substrates and with at least one printing table, which has a first transport device to transport the substrates being printed in a first plane and a lifting device to move the first transport device with the first plane between a printing plane assigned to the printing device and a transport plane lying underneath, the printing table having a second transport device to transport substrates and a second plane beneath the first plane, and in which a fixed spacing between the first plane and the second plane corresponding to the spacing between the printing plane and the transport plane, the method comprising:

moving the first transport device with the first plane in the transport plane;

feeding a first substrate to the first transport device of the first printing table;

moving the first transport device with the first plane in the printing plane for printing of the first substrate by the printing device; and feeding a second substrate to the second transport device lying in the transport plane and transport of the second substrate by the second transport device through the printing table while the printing device is printing the first substrate.

9. The method according to claim 8, wherein the second substrate is fed to an additional first transport device of an additional printing table by the second transport device of the printing table.

10. The method according to claim 8, wherein the printing table arrangement further includes a second printing table having at least one additional first transport device and wherein the method further includes moving the additional first transport device of the second printing table by an additional lifting device into the printing plane for printing of the second substrate by the printing device.

11. The method according to claim 8, wherein the first transport device of the first printing table with a printed first substrate is moved in the transport plane and the printed first substrate is fed by the first transport device of the first printing table to an additional second transport device of an additional printing table, while the printing device is printing the second substrate.

* * * * *